(12) United States Patent
Kanno et al.

(10) Patent No.: US 7,048,360 B2
(45) Date of Patent: May 23, 2006

(54) PIEZOELECTRIC BODY, MANUFACTURING METHOD THEREOF, PIEZOELECTRIC ELEMENT HAVING THE PIEZOELECTRIC BODY, INJECT HEAD, AND INJECT TYPE RECORDING DEVICE

(75) Inventors: Isaku Kanno, Nara (JP); Toshiyuki Matsunaga, Osaka (JP); Takeshi Kamada, Nara (JP); Shintaro Hara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 186 days.

(21) Appl. No.: 10/478,567

(22) PCT Filed: Feb. 19, 2003

(86) PCT No.: PCT/JP03/01826

§ 371 (c)(1),
(2), (4) Date: Nov. 21, 2003

(87) PCT Pub. No.: WO03/070641

PCT Pub. Date: Aug. 28, 2003

(65) Prior Publication Data
US 2004/0189751 A1    Sep. 30, 2004

(30) Foreign Application Priority Data
Feb. 19, 2002    (JP)    ............... 2002-041058

(51) Int. Cl.
B41J 2/45   (2006.01)
H01L 41/08  (2006.01)
C04B 35/00  (2006.01)

(52) U.S. Cl. ............... 347/68; 310/358; 252/62.9 PZT

(58) Field of Classification Search ................. 347/68, 347/70, 71; 310/311, 357, 358; 501/22, 501/23; 252/62.9 PZT; B41J 2/55
See application file for complete search history.

(56) References Cited

U.S. PATENT DOCUMENTS 5,338,999 A * 8/1994 Ramakrishnan et al. .... 310/358

(Continued)

FOREIGN PATENT DOCUMENTS

JP    11-1768 A    1/1999

(Continued)

OTHER PUBLICATIONS

"Effect of Content in Target on Electrical Properties of Laser Ablation Derived Lead Zirconate Thin Films", Zhan-Jie Wang, et al., Jpn.J.Appl.Phys., 2000, vol. 39, pp. 5413-5417.

(Continued)

Primary Examiner—Shih-Wen Hsieh
(74) Attorney, Agent, or Firm—Harness, Dickey & Pierce, P.L.C.

(57) ABSTRACT

In a piezoelectric element comprising a first electrode 2 provided on a substrate 1, a piezoelectric material 3 provided on the first electrode 2 and a second electrode 4 provided on the piezoelectric material 3, the piezoelectric material 3 is configured so as to have a perovskite type crystal structure which is represented by a formula $ABO_3$ and in which the main component for the A site is Pb and the main components for the B site are Zr, Ti and Pb, and configured so that a ratio of Pb atoms to all atoms in the B site is more than 3% and not more than 30%. Namely, the piezoelectric material 3 is formed so as to contain Pb excessively and the excess Pb atoms are activated to be $Pb^{4+}$ during formation of the piezoelectric material 3 and then introduced into the B site.

18 Claims, 4 Drawing Sheets

◐ A SITE ($Pb^{2+}$)
● B SITE ($Pb^{4+}$)
○ OXYGEN ($O^{2-}$)

U.S. PATENT DOCUMENTS

| | | | |
|---|---|---|---|
| 6,091,183 A * | 7/2000 | Nishimura et al. | 310/358 |
| 6,194,848 B1 * | 2/2001 | Lee | 315/370 |
| 6,419,849 B1 * | 7/2002 | Qiu et al. | 252/62.9 R |
| 2001/0001458 A1 * | 5/2001 | Hashizume et al. | 216/2 |

FOREIGN PATENT DOCUMENTS

| | | |
|---|---|---|
| JP | 2000-299510 A | 10/2000 |
| JP | 2001-203404 A | 7/2001 |
| JP | 2001-223404 A | 8/2001 |

OTHER PUBLICATIONS

International Search Report for Application No. PCT/JP03/01826 completed Jun. 2, 2003 and mailed Jun. 17, 2003; ISA/JPO.

* cited by examiner

- ◍ A SITE (Pb$^{2+}$)
- ⊙ B SITE (Zr$^{4+}$ or Ti$^{4+}$)
- ○ OXYGEN (O$^{2-}$)

- ◍ A SITE (Pb$^{2+}$)
- ● B SITE (Pb$^{4+}$)
- ○ OXYGEN (O$^{2-}$)

PIEZOELECTRIC BODY, MANUFACTURING METHOD THEREOF, PIEZOELECTRIC ELEMENT HAVING THE PIEZOELECTRIC BODY, INJECT HEAD, AND INJECT TYPE RECORDING DEVICE

TECHNICAL FIELD

The present invention belongs to technical fields relating to a piezoelectric material having a perovskite type crystal structure and its manufacturing method, and relating to a piezoelectric element, an ink jet head and an ink-jet recording apparatus equipping the piezoelectric material.

BACKGROUND ART

Recently, compactness, power reduction and high-speed drive have been eagerly demanded for equipments with a piezoelectric material including micro-pumps, micro-speakers, micro-switches and ink jet heads. In order to satisfy such demands, a piezoelectric material is formed of a thin film whose volume can be reduced as compared to the case of a conventionally greater used sintered body. Research and development for improving the piezoelectric characteristic of the piezoelectric material formed of such a thin film have been eagerly carried out. For example, Japanese Patent Application Laid-Open (JP-A) No. 2000-299510 discloses that a compositional molar ratio of Pb, Zr and Ti in a piezoelectric material with a perovskite type crystal structure containing Pb, Zr and Ti as the main components (lead zirconate titanate (PZT)), i.e., Pb/(Zr+Ti) is more than 1 and not more than 1.3, which indicates that Pb is contained excessively. Further, in accordance with the aforementioned JP-A No. 2000-299510, the thin-film shaped piezoelectric material can be easily manufactured by being formed on a substrate made of MgO, Si or the like by a sputtering method. The composition of a target used with the sputtering is a mixture of PZT and PbO, and a compositional molar ratio of PZT and PbO, i.e., PbO/(PZT+PbO) is 0.05 to 0.35. As a result, a piezoelectric material containing excess Pb can be easily obtained. This piezoelectric material has a perovskite type crystal structure that is represented by a formula $ABO_3$ and the main component for the A site is Pb and the main components for the B site are Zr and Ti.

However, because the above-described piezoelectric material containing excess Pb may be degenerated under high humidity, it needs to be further improved. As shown in FIG. 8, a piezoelectric element is manufactured by successively forming, on a substrate 101, a first electrode 102, a piezoelectric material 103 and a second electrode 104 by a sputtering method and the like. In the piezoelectric material 103, lattice defects such as grain boundaries 103a usually exist between perovskite type columnar crystal grains. When Pb is provided excessively, the excess Pb atoms enter, as lead oxide ($PbO_x$) and the like, the grain boundary 103a and the like. For this reason, while such a piezoelectric material 103 being exposed to high humidity (especially, high temperature and high humidity) atmosphere, when a voltage is applied between the first and second electrodes 102, 104 so as to apply an electric field to the piezoelectric material 103, a leak current is generated and thus the piezoelectric material 103 may be degenerated with high possibility.

The present invention was developed in view of such points and an object of the present invention is to obtain a piezoelectric material with a large piezoelectric constant and high reliability that is not degenerated even if being exposed to high temperature and high humidity atmosphere.

DISCLOSURE OF THE INVENTION

In order to accomplish the aforementioned object, by introducing the activated excess Pb atoms in the B site of a piezoelectric material with a perovskite type crystal structure represented by a formula $ABO_3$, the amount of Pb entering a grain boundary may be reduced.

Specifically, in accordance with a first invention, in a piezoelectric material having a perovskite type crystal structure represented by a formula $ABO_3$, the main component for the A site is Pb, the main components for the B site are Zr, Ti and Pb, and a ratio of Pb atoms to all atoms in the B site is more than 3% and not more than 30%.

Thus, the excess Pb atom are introduced in the B site and stably held within a crystal lattice, so that the amount of Pb entering a grain boundary can be reduced. As described above, the Pb atom can be easily introduced in the B site. Namely, by appropriately setting film-forming conditions at the time of forming the piezoelectric material by a sputtering method and the like, the Pb atom is activated to be $Pb^{4+}$, and the resultant $Pb^{4+}$ can be easily introduced in the B site. If a ratio of Pb atoms to all atoms in the B site is less than 3%, the amount of Pb entering a grain boundary cannot be sufficiently reduced. On the other hand, if the ratio of Pb atoms to all atoms in the B site is larger than 30%, the crystal structure may be modulated because positions of oxygen atoms within a crystal lattice are changed greatly, and by the influence of internal stress generated by the modulation of the crystal structure, cracks may be generated at the piezoelectric material due to its mechanical displacement caused by application of electric field thereto. Accordingly, the ratio is preferably is more than 3% and not more than 30%. By providing Pb excessively, the piezoelectric constant for the piezoelectric material can be improved. Further, the excess Pb atoms are prevented from entering the grain boundary in order to reduce the amount of $PbO_x$ existing in the grain boundary. As a result, a piezoelectric material with high reliability that is not degenerated even if being exposed to high temperature and high humidity atmosphere can be obtained.

In accordance with a second invention, in the first invention, a compositional molar ratio of Zr and Ti in the B site, i.e., Zr/(Ti+Zr) is more than 0.3 and not more than 0.7.

This can improve the piezoelectric constant for the piezoelectric material to its maximum.

In accordance with a third invention, in the first invention, the crystal structure is such that crystals are preferentially oriented along a (001) plane or (111) plane and their polarization axes are along one axial direction.

The angle formed by a direction of application of electric field and a direction of polarization can be always maintained constant. Thus, rotation of polarization caused by application of electric field does not occur, so that variations in the piezoelectric characteristic can be suppressed to its minimum. Further, when the direction of polarization coincides the direction of application of electric field, larger piezoelectric characteristic with less variation can be obtained.

In accordance with a fourth invention, in a piezoelectric material having a perovskite type crystal structure represented by a formula $ABO3$, the main component for the A site is Pb, the main components for the B site are Zr, Ti and Pb, and a Pb atom in the A site exists as $Pb^{2+}$, and a Pb atom in the B site exists as $Pb^{4+}$.

Because of this invention, same as in the first invention, the excess Pb atoms are introduced in the B site as $Pb^{4+}$ and thus the amount of $PbO_x$ existing in a grain boundary can be reduced. Consequently, the piezoelectric constant for the piezoelectric material can be improved and a reliability with respect to a leak current can be also improved.

In accordance with a fifth invention, in the fourth invention, a ratio of Pb atoms to all atoms in the B site is more than 3% and not more than 30%.

As described above, while cracks generated at the piezoelectric material is being suppressed, the amount of $PbO_x$ existing in a grain boundary can be sufficiently reduced.

In accordance with a sixth invention, in the fourth invention, a compositional molar ratio of Zr and Ti in the B site, i.e., Zr/(Ti+Zr) is more than 0.3 and not more than 0.7.

The same operations and effects as in the second invention can be obtained.

In accordance with a seventh invention, in the fourth invention, the crystal structure is such that crystals are preferentially oriented along a (001) plane or (111) plane and their polarization axes are along one axial direction.

The same operations and effects as in the third invention can be obtained.

In accordance with an eighth invention, there is provided a method for manufacturing a piezoelectric material having a perovskite type crystal structure represented by a formula $ABO_3$ in which the main component for the A site is Pb and the main components for the B site are Zr, Ti and Pb by forming on a substrate with a sputtering method, the method comprising the steps of: setting the temperature of the substrate during sputtering to more than 400° C. and not more than 700° C.; providing a mixture gas of argon and oxygen as a sputtering gas used at the time of the sputtering and setting the partial pressure ratio of oxygen in the sputtering gas to more than 2% and not more than 30%; setting the pressure of the sputtering gas to more than 0.01 Pa and not more than 3.0 Pa; and setting the density of high frequency electric power applied to a target during the sputtering is 1.0 to 10 $W/cm^2$.

Because of this invention, a Pb atom can be activated to be $Pb^{4+}$ and the resultant $Pb^{4+}$ can be easily introduced in the B site. As a result, the piezoelectric material according to the first or fourth invention can be easily manufactured.

In accordance with a ninth invention, in the eighth invention, the pressure of the sputtering gas is set to more than 0.01 Pa and not more than 1.0 Pa.

In accordance with a tenth invention, in the eighth invention, the partial pressure ratio of oxygen in the sputtering gas is set to more than 2% and not more than 10%.

In accordance with an eleventh invention, in the eighth invention, the density of high frequency electric power applied to a target during the sputtering is 2.5 to 10 $W/cm^2$.

Because of the ninth to eleventh inventions, the Pb atoms are further easily activated, and the piezoelectric material according to the first or fourth invention can be reliably obtained.

In accordance with a twelfth invention, there is provided a piezoelectric element comprising: a first electrode provided on a substrate; a piezoelectric material provided on the first electrode and has a perovskite type crystal structure represented by a formula $ABO_3$; and a second electrode provided on the piezoelectric material. In this invention, the main component for the A site of the piezoelectric material is Pb, the main components for the B site of the piezoelectric material are Zr, Ti and Pb, and a ratio of Pb atoms to all atoms in the B site of the piezoelectric material is more than 3% and not more than 30%.

Because of this invention, the same operations and effects as in the first invention can be obtained, and this piezoelectric element may be widely utilized as an actuator or sensor.

In accordance with a thirteenth invention, in the twelfth invention, a compositional molar ratio of Zr and Ti in the B site of the piezoelectric material, i.e., Zr/(Ti+Zr) is increased from the first electrode side toward the second electrode side.

When a piezoelectric material is formed on a first electrode provided on a substrate, the amount of Zr having a low affinity with Pb is reduced during the initial period for forming the piezoelectric material. Thus, a Pb atom can be further stably introduced in the B site.

In accordance with a fourteenth invention, there is provided a piezoelectric element comprising: a first electrode provided on a substrate; a piezoelectric material provided on the first electrode and has a perovskite type crystal structure represented by a formula $ABO_3$; and a second electrode provided on the piezoelectric material, wherein the main component for the A site of the piezoelectric material is Pb, the main components for the B site of the piezoelectric material are Zr, Ti and Pb, and a Pb atom in the A site of the piezoelectric material exists as $Pb^{2+}$, and a Pb atom in the B site of the piezoelectric material exists as $Pb^{4+}$.

The same operations and effects as in the fourth invention can be obtained, and this piezoelectric element may be widely utilized as an actuator or sensor.

In accordance with a fifteenth invention, in the fourteenth invention, a compositional molar ratio of Zr and Ti in the B site of the piezoelectric material, i.e., Zr/(Ti+Zr) is increased from the first electrode side toward the second electrode side.

The same operations and effects as in the thirteenth invention can be obtained.

In accordance with a sixteenth invention, there is provided an ink jet head that comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink, and that is configured so as to discharge the ink in the pressure chamber by displacing the vibration plate in the thickness direction of the piezoelectric material because of the piezoelectric effect of the piezoelectric material. In this invention, the main component for the A site of the piezoelectric material is Pb, the main components for the B site of the piezoelectric material are Zr, Ti and Pb, and a ratio of Pb atoms to all atoms in the B site of the piezoelectric material is more than 3% and not more than 30%.

In accordance with a seventeenth invention, there is provided an ink jet head that comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink, and that is configured so as to discharge the ink in the pressure chamber by displacing the vibration plate in the thickness direction of the piezoelectric material because of the piezoelectric effect of the piezoelectric material, wherein the main component for the A site of the piezoelectric material is Pb, the main components for the B site of the piezoelectric material are Zr, Ti and Pb, and a Pb atom in the A site of the piezoelectric material exists as $Pb^{2+}$, and a Pb atom in the B site of the piezoelectric material exists as $Pb^{4+}$.

Because of the sixteenth and seventeenth inventions, an ink jet head whose ink ejection performance is excellent and stable without varied depending on environments can be obtained.

In accordance with an eighteenth invention, there is provided an ink-jet recording apparatus that comprises an ink jet head which comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink and which ink jet head is configured so as to be capable of relative movement with respect to a recording medium, and the ink-jet recording apparatus being configured so as to displace the vibration plate in the thickness direction of the piezoelectric material because of the piezoelectric effect of the piezoelectric material in the ink jet head while the ink jet head is being relatively moved with respect to the recording medium in order to discharge the ink in the pressure chamber from a nozzle hole communicating with the pressure chamber toward the recording medium and to perform recording. In accordance with this invention, the main component for the A site of the piezoelectric material in the ink jet head is Pb, the main components for the B site of the piezoelectric material are Zr, Ti and Pb, and a ratio of a Pb atom to all atoms in the B site of the piezoelectric material is more than 3% and not more than 30%.

In accordance with a nineteenth invention, there is provided an ink-jet recording apparatus that comprises an ink jet head which comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink and which ink jet head is configured so as to be capable of relative movement with respect to a recording medium, the ink-jet recording apparatus being configured so as to displace the vibration plate in the thickness direction of the piezoelectric material because of the piezoelectric effect of the piezoelectric material in the ink jet head while the ink jet head is being relatively moved with respect to the recording medium in order to discharge the ink in the pressure chamber from a nozzle hole communicating with the pressure chamber toward the recording medium and to perform recording, wherein the main component for the A site of the piezoelectric material in the ink jet head is Pb, the main components for the B site of the piezoelectric material are Zr, Ti and Pb, and a Pb atom in the A site of the piezoelectric material exists as $Pb^{2+}$, and a Pb atom in the B site of the piezoelectric material exists as $Pb^{4+}$.

Because of the eighteenth and nineteenth inventions, a recording apparatus whose printing performance is always excellent without influenced by environments the apparatus is used can be easily obtained.

BEST MODE FOR CARRYING OUT THE INVENTION

First Embodiment

Figure 1:
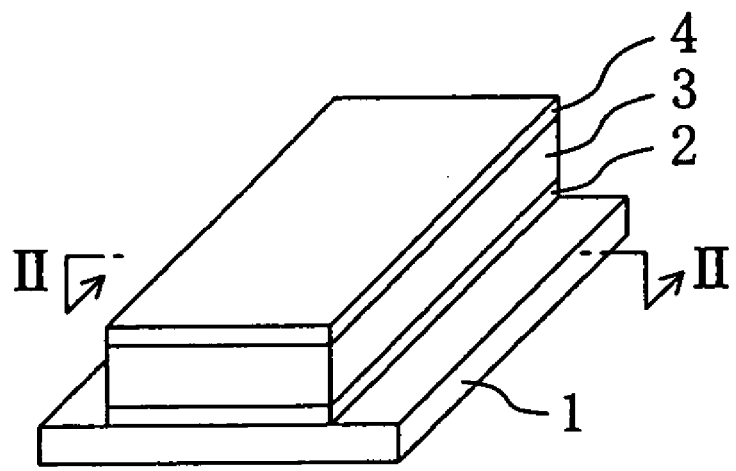
FIG. 1 is a perspective view illustrating a piezoelectric element with a piezoelectric material according to embodiments of the present invention.
Figure 2:
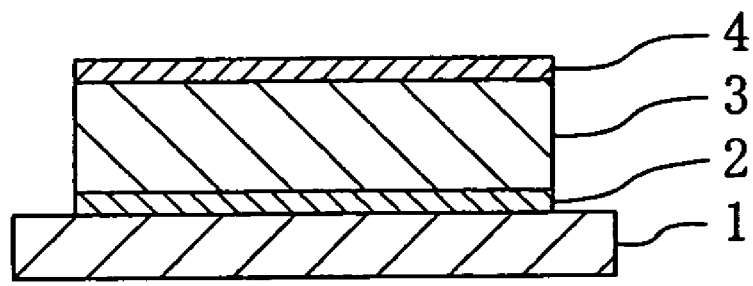
FIG. 2 is a cross-sectional view taken along a line II—II shown in FIG. 1.

FIGS. 1 and 2 illustrate a piezoelectric element comprising a piezoelectric material 3 according to embodiments of the present invention. This piezoelectric element comprises a first electrode 2 provided on a substrate 1, the piezoelectric material 3 provided on the first electrode 2 and a second electrode 4 provided on the piezoelectric material 3.

The substrate 1 is made of, e.g., silicon (Si) with a thickness of 0.2 mm. The first and second electrodes 2, 4 are made of, e.g., platinum (Pt) with a thickness of 0.1 μm.

Figure 3:
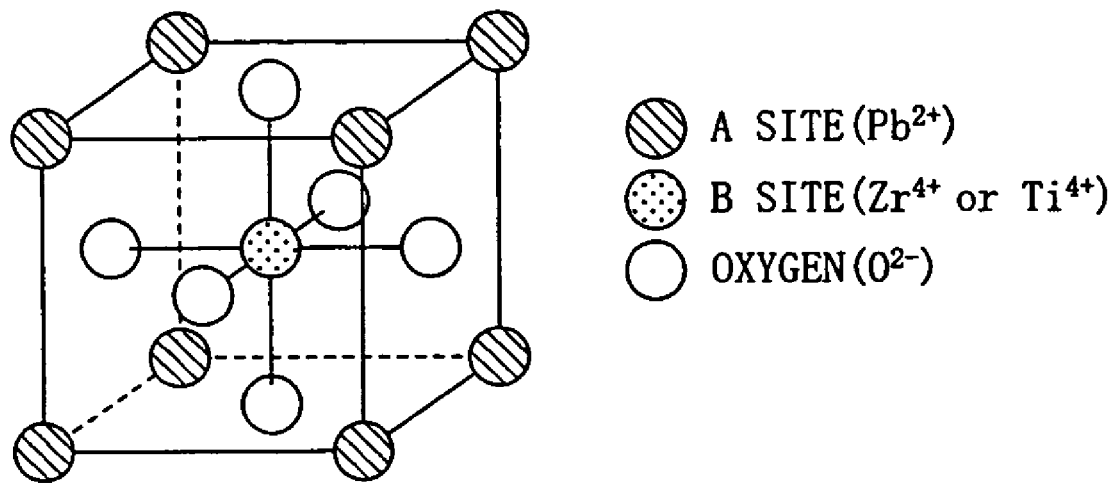
FIG. 3 is a view illustrating a crystal lattice that the B site is Zr or Ti in the crystal structure of the piezoelectric material.
Figure 4:
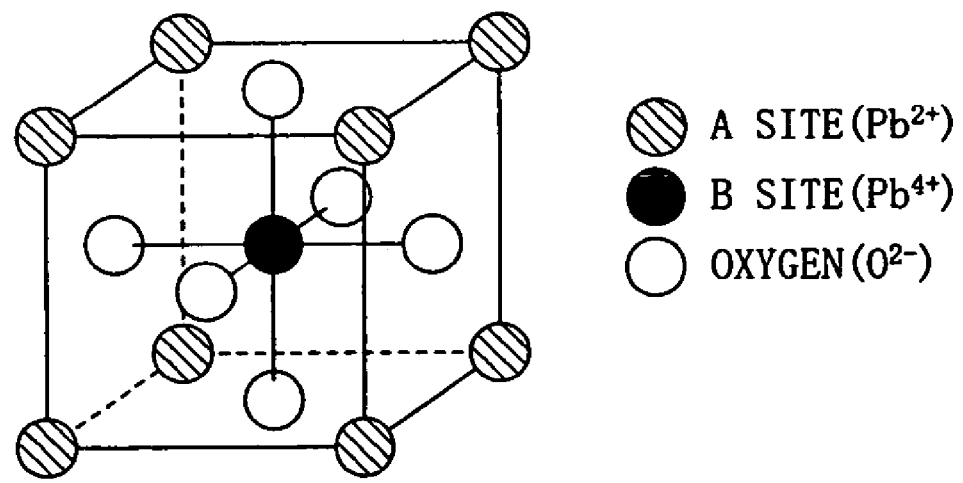
FIG. 4 is a view illustrating a crystal lattice that the B site is Pb in the crystal structure of the piezoelectric material.

The piezoelectric material 3 is made of piezoelectric materials containing lead (Pb), zirconium (Zr) and titanium (Ti) as the main component and has a perovskite type crystal structure represented by a formula $ABO_3$ in which the main component for the A site is Pb and the main components for the B site are Zr, Ti and Pb. Namely, this piezoelectric material 3 is formed of, as in conventional lead zirconate titanate, a first crystal lattice in which a Zr or Ti atom is placed at its center as shown in FIG. 3 and a second crystal lattice in which a Pb atom is placed at its center as shown in FIG. 4. While a Pb atom in the A site exists as $Pb^{2+}$, Zr, Ti and Pb atoms in the B site exist as $Zr^{4+}$, $Ti^{4+}$ and $Pb^{4+}$, respectively.

In this embodiment, the ratio of Pb atoms to all atoms in the B site is about 10%. In other words, about 10 mol % of $Pb^{4+}$ exist in the B site. Namely, while about 10% of the second crystal lattice exist, about 90% of the first crystal lattice exists.

In accordance with this embodiment, the crystal structure of the piezoelectric material 3 is such that crystals are preferentially oriented along a (001) plane and their polarization axes are along the thickness direction of the piezoelectric material 3. The thickness of the piezoelectric material 3 is 3 μm.

The piezoelectric element is manufacturing by successively forming, on the substrate 1, the first electrode 2, the piezoelectric material 3 and the second electrode 4 by a sputtering method. When the first and second electrodes 2, 4 are formed, the temperature of the substrate 1 during sputtering is set to 500° C. and a room temperature, respectively, argon (Ar) is used as a sputtering gas and the pressure of this sputtering gas is set to 1 Pa.

When the piezoelectric material 3 is formed, the temperature of the substrate 1 during sputtering is set to 650° C. A mixed gas of argon and oxygen is determined as a sputtering gas used for sputtering. The partial pressure ratio of oxygen in the sputtering gas is set to 10% (Ar: 90% by volume, $O_2$: 10% by volume), and the pressure of the sputtering gas is set to 0.5 Pa. For a target, an oxide containing Pb, Zr and Ti as the main component (in this embodiment, oxide with a chemical composition of $0.1(PbO)+0.9(PbZr_{0.53}Ti_{0.47}O_3)$) (in this embodiment, $PbZr_{0.53}Ti_{0.47}O_3$ will be referred to as PZT) is provided. The density of high frequency electric power applied to the target during the sputtering is set to $3W/cm^2$. Further, a sputtering time is 100 minutes.

The resultant piezoelectric material 3 has a chemical composition represented by $Pb_{1.11}Zr_{0.47}Ti_{0.42}O_3$ and contains Pb excessively. In this piezoelectric material 3, a compositional molar ratio of Zr and Ti in the B site, i.e., Zr/(Ti+Zr) is determined as follows.

Namely, $0.47/(0.47+0.42)=0.53$.

Because of excess Pb as described above, the piezoelectric characteristic of the piezoelectric material 3 represented by $Pb(Zr, Ti)O_3$ can be improved. Nevertheless, the excess Pb atoms exist unstably in a lattice defect such as a grain boundary. For this reason, when a voltage is applied between the first and second electrodes 2, 4 under high humidity, a leak current is generated and thus the piezoelectric material 3 may be modulated with high possibility. As in the case of forming a ferroelectric film, when an (amorphous) film formed without heating a substrate is thermally treated at subsequent high temperatures (700 to 800° C.) to be crystallized, the film containing excess Pb can be obtained, but the Pb atom does not exist in the B site. The excess Pb atoms are considered to exist at the grain boundary as amorphous $PbO_x$ and the like.

In accordance with this embodiment, by introducing the excess Pb atoms into not the A site but the B site, the excess Pb atoms are prevented from entering the grain boundary in order to reduce the amount of $PbO_x$ existing in the grain boundary. As a result, high piezoelectric characteristic can be obtained and reliability can be improved.

Specifically, the ionic radius of $Pb^{4+}$ is 0.92 Å, the ionic radius of $Zr^{4+}$ is 0.86 Å and the ionic radius of $Ti^{4+}$ is 0.75 Å. The ionic radius of $Pb^{4+}$ approximates the ionic radius of $Zr^{4+}$ and $Ti^{4+}$. Thus, it is considered that Pb can be introduced into the B site under specific film-forming conditions in view of crystal structure. In accordance with a vapor phase growth method in plasma such as a sputtering method, unlike an ordinary thermal equilibrium process, the surface of the substrate 1 is activated and the reaction that the Pb atom is introduced into the B site as $Pb^{4+}$ is easily occurred. Accordingly, at the time of forming the piezoelectric material 3 by the sputtering method, by utilizing a condition for activating the Pb atom so as to be $Pb^{4+}$ as the film-forming condition, the kinetic energy of the sputtered Pb atom is increased and the surface of the substrate 1 is activated. As a result, the Pb atom can be partially introduced into the B site, which has not been generally occurred.

In accordance with this embodiment, as described above, the temperature of the substrate 1 during sputtering is set to 650° C., the partial pressure ratio of oxygen in a sputtering gas is set to 10%, the pressure of the sputtering gas is set to 0.5 Pa, and the density of high frequency electric power applied to a target during sputtering is set to $3W/cm^2$. As a result, a Pb atom can be activated to be $Pb^{4+}$ and thus the Pb atom can be introduced into the B site.

The temperature of the substrate 1 may be higher than the ordinary film-forming condition, i.e., 400° C. to 700° C. The partial pressure ratio of oxygen in a sputtering gas may be lower than the ordinary film-forming condition, i.e., more than 2% and not more than 30%. The pressure of the sputtering gas may be lower than the ordinary film-forming condition, i.e., more than 0.01 Pa and not more than 3.0 Pa. The density of high frequency electric power may be higher than the ordinary film-forming condition, i.e., 1.0 to $10W/cm^2$. Under such film-forming conditions, a Pb atom can be activated to be $Pb^{4+}$. Particularly, while the temperature of the substrate 1 is 400° C. to 700° C., under sputtering conditions enabling discharge, if the partial pressure ratio of oxygen in the sputtering gas is more than 2% and not more than 10% (i.e., if a volume ratio of argon to oxygen $Ar/O_2$ is more than 98/2 and not more than 90/10), the pressure of the sputtering gas is more than 0.01 Pa and not more than 1.0 Pa or the density of high frequency electric power is more than $2.5W/cm^2$ and not more than $10W/cm^2$, a Pb atom can be highly activated with reliability. This is confirmed by a spectral analysis for discharging plasma.

The crystal structure of the piezoelectric material 3 formed under such sputtering conditions was evaluated by a powder X-ray diffraction method performed by irradiating strong X-ray of radiated light (BL02B line) at large irradiation facility SPring-8 in Hyogo prefecture, Japan. As a result, it was apparent that about 10 mol % of Pb existed as $Pb^{4+}$ in the B site in which Zr or Ti usually existed. Further, as the result of a composition analysis with an X-ray micro-analyzer, the chemical composition was $Pb_{1.11}Zr_{0.47}Ti_{0.42}O_3$ (which may be represented as $Pb\{Pb_{0.11}(Zr_{0.53}Ti_{0.47})_{0.89}\}O_3$). This result of the composition analysis proves that about 10 mol % of the excess Pb atoms are introduced into the B site.

The resultant piezoelectric element was placed in an atmosphere that a temperature was 60° C. and a relative humidity was 80%. Then, 30V of rated voltage was applied between the first and second electrodes 2, 4 in order to continuously drive the piezoelectric element for ten days. As a result, the piezoelectric material 3 was not degenerated and a deterioration in the piezoelectric characteristic was not observed. For the purpose of comparison, a piezoelectric element that the excess Pb atoms were not introduced into the B site but existed in a grain boundary as amorphous $PbO_x$ (see sample No. 5 to be described later) was similarly driven. The piezoelectric material was degenerated in about three days and the piezoelectric characteristic was deteriorated in an accelerated manner.

Consequently, by a Pb atom entering the B site which is different from a site that the Pb atom usually enters, it is possible to prevent the excess Pb atoms from being deposited as $PbO_x$ in the grain boundary. Further, a leak current is hardly generated even under high humidity and thus the reliability can be improved.

The above-described piezoelectric element can be used for various equipments including, as well as ink jet heads (ink-jet recording apparatuses) to be described later, micro-pumps, micro-speakers and micro-switches.

In accordance with the above-described embodiment, although the ratio of Pb atoms to all atoms in the B site is about 10%, 3% or more of the ratio can sufficiently reduce the amount of Pb entering the grain boundary, so that an improvement in reliability can be sufficiently obtained. If the ratio of the Pb atom exceeds 30%, a crystal structure is changed because positions of oxygen atoms in a crystal lattice are greatly varied. As a result, by the influence of an internal stress caused by the change of the crystal structure, cracks are generated in the piezoelectric material 3 in accordance with its mechanical displacement due to application of electric field to the piezoelectric material 3. Accordingly, more than 3% and not more than 30% of the total atoms in the B site may be preferably the Pb atoms.

In accordance with the above-described embodiment, the composition of a target used for forming the piezoelectric material 3 is a mixture of PZT and PbO, and a compositional molar ratio of PZT and PbO, i.e., PbO/(PZT+PbO) (amount of excess PbO) is set to 0.1. Nevertheless, the amount of the excess PbO may be more than 0 and not more than 0.35. Even if the amount of the excess PbO is 0, by optimizing the temperature of the substrate 1, the pressure of a sputtering gas and the partial pressure ratio of oxygen, 10% or more of all atoms in the B site may be Pb atoms.

Further, in accordance with the above-described embodiment, the compositional molar ratio of Zr and Ti in the B site for the piezoelectric material 3, i.e., Zr/(Ti+Zr) is set to 0.53. Nevertheless, more than 0.3 and not more than 0.7 of the compositional molar ratio Zr/(Ti+Zr) is preferable because it can improve a piezoelectric constant for the piezoelectric material 3 to its maximum. Further, when the compositional molar ratio Zr/(Ti+Zr) is increased from the first electrode 2 side toward the second electrode 4 side, at the time of forming the piezoelectric material 3 on the substrate 1 (on the first electrode 2), the amount of Zr with low affinity with Pb is reduced during the initial period for forming the piezoelectric material 3 and thus a Pb atom can be further stably introduced into the B site, which is even further preferable.

Additionally, a part of Pb atoms in the A site is substituted by lanthanum (La) or strontium (Sr). As a result, even if the temperature of the substrate 1 is lower, crystal growth is accelerated in a thermally non-equilibrium manner and the Pb atom can be more stably introduced into the B site.

In the piezoelectric material 3, crystals may be preferentially oriented along a (111) plane and their polarization axes may be along one axial direction such as a direction of <111> or the like.

In accordance with the above-described embodiment, the piezoelectric material 3 is formed on the substrate 1 made of silicon. Nevertheless, the substrate 1 may be made of magnesium oxide (MgO) or contain iron such as stainless steel and the like as its main component.

Moreover, although the first and second electrodes 2, 4 are made of platinum in the above-described embodiment, the present invention is not limited to such material and the first and second electrodes 2, 4 may be made of strontium ruthenate, ruthenium oxide, palladium or iridium and the like.

In addition, in accordance with the above-described embodiment, the piezoelectric material 3 is formed by a sputtering method. Nevertheless, by forming the piezoelectric material 3 by, e.g., a plasma CVD method, a Pb atom can be introduced, as $Pb^{4+}$, into the B site. The first and second electrodes 2, 4 may be formed by any film-forming methods.

As shown in Table 1, five kinds of piezoelectric materials (samples Nos. 1 to 5) were formed by changing the composition of a target and sputtering film-forming conditions. Sample No. 1 shown in Table 1 is the same as the one described in the above-described embodiment. The partial pressure ratio of oxygen in a sputtering gas for Sample No. 5 is 50% and thus is out of the appropriate range described in the above embodiment (i.e., more than 2% and not more than 10%).

TABLE 1

| Sample | Composition of target | Temperature of substrate (° C.) | Gas pressure (Pa) | Ar/$O_2$ | Density of high frequency electric power (W/cm$^2$) |
|---|---|---|---|---|---|
| No. 1 | 0.1(PbO) + 0.9(PZT) | 650 | 0.5 | 90/10 | 3 |
| No. 2 | 0.3(PbO) + 0.7(PZT) | 650 | 0.5 | 90/10 | 3 |
| No. 3 | PZT | 550 | 0.5 | 95/5 | 3 |
| No. 4 | PZT | 650 | 0.5 | 90/10 | 3 |
| No. 5 | 0.3(PbO) + 0.7(PZT) | 550 | 2.0 | 50/50 | 2 |

For the piezoelectric materials of sample Nos. 1 to 5, the amount of Pb ($Pb^{4+}$) in the B site obtained by the powder X-ray diffraction method utilizing the aforementioned strong X-ray, a chemical composition determined by an X-ray micro-analyzer (XMA), the amount of excess Pb considered to exist at a grain boundary obtained by reversely calculating the amount of Pb in the B site and the chemical composition, a piezoelectric constant $d_{31}$(pC/N) illustrating piezoelectric characteristics of piezoelectric elements (the area of electrode is 0.35cm$^2$) manufactured by using each piezoelectric material and leak current values immediately after 30 V of rated voltage is applied between the first and second electrodes under an atmosphere of 60° C. in temperature and 80% in relative humidity in order to continuously drive the piezoelectric materials and after 80 hours are illustrated in Table 2.

TABLE 2

| Sample | Amount of Pb in B site (mol %) | Pb/Zr/Ti/O (result by XMA) | Amount of Pb in grain boundary (mol %) | Piezoelectric constant $d_{31}$ (pC/N) | Leak current value (nA) Immediately after application | Leak current value (nA) After 80 hours |
|---|---|---|---|---|---|---|
| No. 1 | 10 | 1.11/0.47/0.42/3 | 0 | 115 | 4.7 | 5.6 |
| No. 2 | 27 | 1.28/0.37/0.35/3 | 0 | 130 | 6.8 | 7.8 |
| No. 3 | 7 | 1.07/0.50/0.43/3 | 0 | 110 | 4.3 | 5.5 |
| No. 4 | 0 | 0.97/0.55/0.48/3 | 0 | 63 | 3.2 | 4.7 |
| No. 5 | 0 | 1.03/0.52/0.47/3 | 3 | 85 | 62.4 | 2300 |

As a result, in accordance with samples Nos. 1 to 3, it is found that a Pb atom is introduced into the B site, Pb does not exist at a grain boundary and the piezoelectric characteristic and the reliability with respect to a leak current are improved. As in sample No. 3, even if the amount of excess PbO in a target is 0, a Pb atom can be introduced into the B site depending on the film-forming conditions.

Additionally, in sample No. 4, Pb is not excess and thus a Pb atom is not introduced into the B site. Further, Pb does not exist in a grain boundary. For this reason, although the piezoelectric characteristic is not so excellent, the reliability with respect to a leak current is excellent.

Furthermore, in sample No. 5, a Pb atom is not introduced into the B site and the excess Pb atoms exist in a grain boundary as amorphous $PbO_x$ and the like. This is because the partial pressure ratio of oxygen during sputtering is significantly large and thus the activity of the Pb atom is low and the Pb atom is not introduced into the B site.

Accordingly, it is found that as in samples Nos. 1 to 3, by improving the piezoelectric characteristic by providing Pb excessively and introducing the excess Pb atoms into the B site not so as to enter a grain boundary, the reliability with respect to a leak current can be improved.

Second Embodiment

Figure 5:
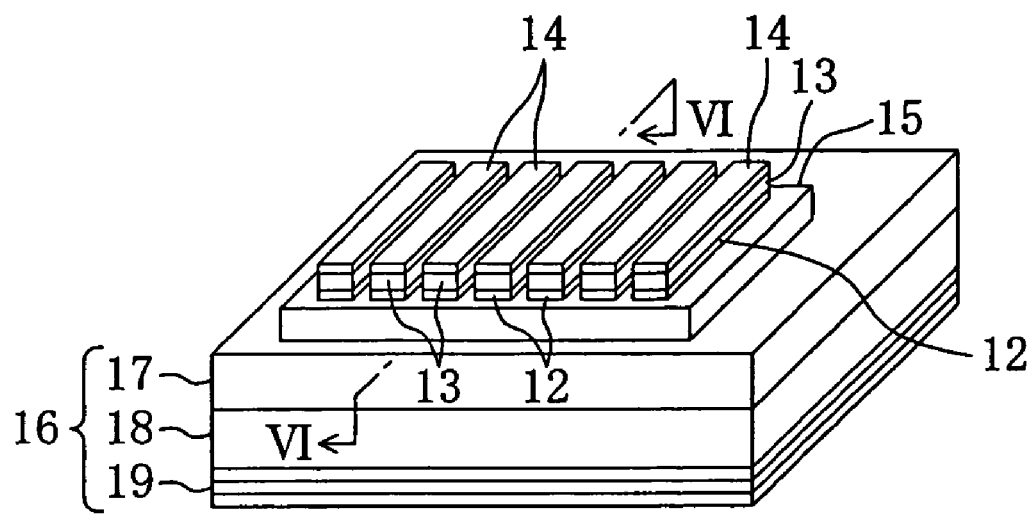
FIG. 5 is a perspective view illustrating an ink jet head according to the embodiments of the present invention.
Figure 6:
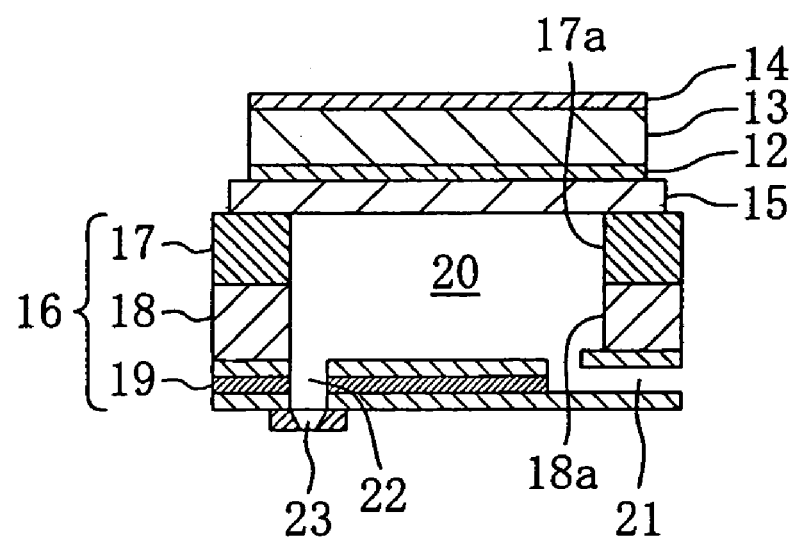
FIG. 6 is a cross-sectional view taken along a line VI—VI shown in FIG. 5.

FIGS. 5 and 6 illustrate an ink jet head according to the embodiments of the present invention. This ink jet head includes a plurality of the piezoelectric materials 13 that are the same as those of the first embodiment, a plurality of pairs of first and second electrodes 12, 14 (that are the same as the first and second electrodes 2, 4 described in the first embodiment) respectively provided on surfaces of each of the piezoelectric materials 13 in its thickness direction, a vibration plate 15 provided on the surface of one electrode (the first electrode 12) opposite the surface on which the piezoelectric material 13 is provided (i.e., on the lower surface of the first electrode 12) and a pressure chamber member 16 that is joined on the surface of the vibration plate 15 opposite the surface on which the first electrode 12 is provided (i.e., on the lower surface of the vibration plate 15) and is used for structuring a pressure chamber 20 for accommodating an ink. In this embodiment, 200 piezoelectric materials 13 are provided per inch.

The vibration plate 15 is made of silicon oxide (SiO) having a thickness of 3.5 μm. The pressure chamber member 16 is configured by a first member 17 that is joined on the vibration plate 15 and made of silicon, a second member 18 that is joined on the opposite surface (undersurface) of the vibration plate 15 of the first member 17 and is made of stainless steel and the like, and a third member 19 that is joined on the opposite surface (undersurface) of the first member 17 of the second member 18 and is formed by laminating a plurality of plate materials made of stainless steel and the like.

Through-holes 17a, 18a that pass through the first and second members 17, 18 along their thickness directions are formed at portions of the first and second members 17, 18 corresponding to each of the piezoelectric materials 13. The through-holes 17a, 18a are respectively closed by the vibration plate 15 and the third member 19 so as to be formed into a pressure chamber 20.

The third member 19 is provided with an ink inflow path 21 which is connected to an unillustrated ink tank and communicates with the pressure chamber 20 in order to flow an ink into the pressure chamber 20, an ink ejection path 22 which communicates with the pressure chamber 20 to discharge the ink in the pressure chamber 20 and a nozzle hole 23 which is connected to an opening formed at the side of the ink ejection path 22 opposite the side at which the pressure chamber 20 is provided (i.e., at the lower side of the ink ejection path 22).

When a voltage is applied between the first electrodes 12 and the second electrodes 14, corresponding to each of the piezoelectric materials 13 for an ink jet head, portions of the vibration plate 15 corresponding to each pressure chamber 20 are displaced along the thickness directions of the piezoelectric materials 13 because of the piezoelectric effect of each piezoelectric material 13. As a result, an ink in each of the pressure chambers 20 is discharged from the nozzle hole 23 which communicates via the ink ejection path 22 with the pressure chamber 20.

In order to manufacture the above-describe ink jet head, a piezoelectric element which is the same as in the first embodiment (in the second embodiment, the vibration plate 15 is added) is firstly manufactured. Namely, the first member 17 of the pressure chamber member 16 (without the through-hole 17a being formed) is used as a substrate which is the same as in the first embodiment. On this substrate (the first member 17), the vibration plate 15, the first electrode 12, the piezoelectric material 13 and the second electrode 14 are successively formed by a sputtering method. Conditions for forming the piezoelectric material 13 are the same as in the first embodiment. Excess Pb atoms are activated to be $Pb^{4+}$ and then introduced into the B site.

Next, a resist is applied on the second electrode 14 by spin coating. The resultant resist is positioned with respect to positions at which the pressure chambers 20 should be formed, subjected to exposure and development and is patterned. Then, the second electrodes 14, the piezoelectric materials 13 and the first electrodes 12 are individuated by dry etching. Further, the vibration plate 15 is finished to a predetermined configuration.

Subsequently, the through-hole 17a is formed in the first member 17. Specifically, an etching mask is formed at the portion that the through-hole 17a is not formed on the surface of the first member 17 opposite the surface on which the aforementioned films are formed. Thereafter, the through-hole 17a is formed by anisotropic dry etching.

The second member 18 with the through-hole 18a having been formed in advance and the third member 19 with the ink inflow path 21, the ink ejection path 22 and the nozzle hole 23 having been formed in advance are joined by adhesion.

The second member 18 joined on the third member 19 is joined on the surface of the first member 17 opposite the surface at which each of the aforementioned films is formed by adhesion, so that an ink jet head is completed.

Because this ink jet head has a piezoelectric element which is the same as in the first embodiment, its ink ejection performance is stable and excellent even if it is exposed to high temperature and high humidity atmosphere.

Third Embodiment

Figure 7:
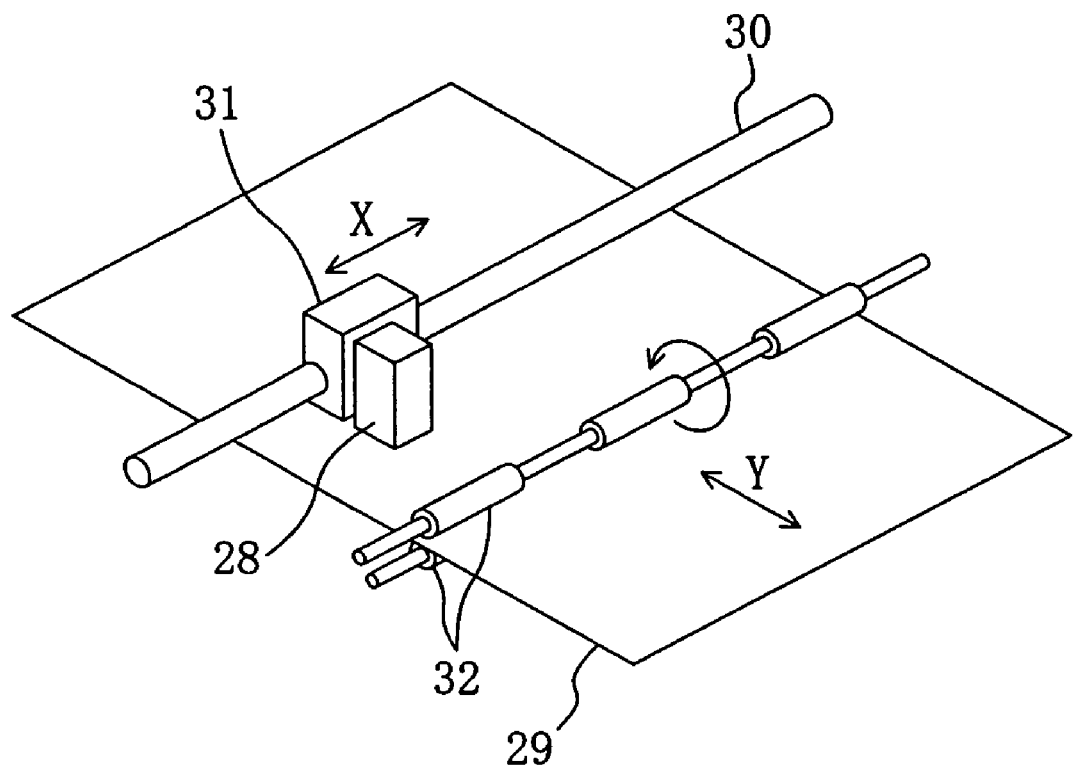
FIG. 7 is a schematic perspective view illustrating an ink-jet recording apparatus according to the embodiments of the present invention.
Figure 8:
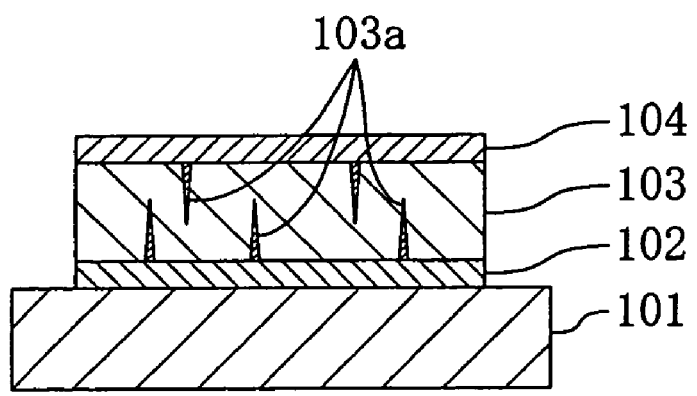
FIG. 8 is a cross-sectional view of a conventional piezoelectric material.

FIG. 7 illustrates an ink-jet recording apparatus according to the embodiments of the present invention. This ink-jet recording apparatus includes an ink jet head 28 which is the same as in the second embodiment. In this ink jet head 28, it is configured so that an ink in a pressure chamber (pressure chamber 20 in the second embodiment) is discharged from a nozzle hole (nozzle hole 23 in the second embodiment)

provided so as to communicate with the pressure chamber toward a recording medium 29 (recording paper or the like) so as to be recorded thereon.

The ink jet head 28 is mounted on a carriage 31 provided at a carriage shaft 30 extending in a main scanning direction X. The ink jet head 28 is configured so as to be reciprocally moved along the main scanning direction X in accordance with the carriage 31 being reciprocally moved along the carriage shaft 30. Thus, the carriage 31 constitutes relative movement means for relatively moving the ink jet head 28 and the recording medium 29 in the main scanning direction X.

The ink-jet recording apparatus also comprises a plurality of rollers 32 for moving the recording medium 29 in a sub-scanning direction Y which is substantially perpendicular to the main scanning direction X of the ink jet head 28 (i.e., widthwise direction). The plurality of rollers 32 constitute relative movement means for relatively moving the ink jet head 28 and the recording medium 29 in the sub-scanning direction Y.

When the ink jet head 28 is moved in the main scanning direction X by the carriage 31, an ink is discharged from nozzle holes of the ink jet head 28 toward the recording medium 29. When recording for one scan ends, the recording medium 29 is moved by a predetermined amount by the rollers 32 and then recording for the next scan is performed.

Because the ink-jet recording apparatus comprises the ink jet head 28 which is the same as in the second embodiment, its printing performance is stable and excellent even if being exposed to high temperature and high humidity atmosphere.

INDUSTRIAL APPLICABILITY

A piezoelectric material and piezoelectric element of the present invention are useful for equipments including micropumps, micro-speakers, micro-switches and ink jet heads (ink-jet recording apparatuses). The industrial applicability is high in view of a piezoelectric material with large piezoelectric constant and high reliability that is not degenerated even if being exposed to high temperature and high humidity atmosphere can be obtained.

The invention claimed is:

1. A piezoelectric material having a perovskite type crystal structure represented by a formula $ABO_3$,
    wherein the main component for the A site is Pb,
    the main components for the B site are Zr, Ti and Pb, and
    a ratio of Pb atoms to all atoms in the B site is more than 3% and not more than 30%.

2. The piezoelectric material according to claim 1, wherein the crystal structure is such that crystals are preferentially oriented along a (001) plane or (111) plane and their polarization axes are along one axial direction.

3. A piezoelectric material having a perovskite type crystal structure represented by a formula $ABO_3$,
    wherein the main component for the A site is Pb,
    the main components for the B site are Zr, Ti and Pb,
    a ratio of Pb atoms to all atoms in the B site is more than 3% and not more than 30% and
    wherein a compositional molar ratio of Zr and Ti in the B site, i.e., Zr/(Ti+Zr) is more than 0.3 and not more than 0.7.

4. A piezoelectric material having a perovskite type crystal structure represented by a formula $ABO_3$,
    wherein the main component for the A site is Pb,
    the main components for the B site are Zr, Ti and Pb,
    a Pb atom in the A site exists as $Pb^{2+}$, and a Pb atom in the B site exists as $Pb^{4+}$; and
    wherein a ratio of PB atoms to all atoms in the B site is more than 3% and not more than 30%.

5. The piezoelectric material according to claim 4, wherein the crystal structure is such that crystals are preferentially oriented along a (001) plane or (111) plane and their polarization axes are along one axial direction.

6. A piezoelectric material having a perovskite type crystal structure represented by a formula $ABO_3$,
    wherein the main component for the A site is Pb,
    the main components for the B site are Zr, Ti and Pb,
    a Pb atom in the A site exists as $Pb^{2+}$, and a Pb atom in the B site exists as $Pb^{4+}$; and
    wherein a compositional molar ratio of Zr and Ti in the B site, i.e., Zr(Ti+Zr) is more than 0.3 and not more than 0.7.

7. A method for manufacturing a piezoelectric material having a perovskite type crystal structure represented by a formula $ABO_3$ in which the main component for the A site is Pb and the main components for the B site are Zr, Ti and Pb by forming on a substrate with a sputtering method, said method comprising the steps of:
    setting the temperature of the substrate during sputtering to more than 400° C. and not more than 700° C.;
    providing a mixture gas of argon and oxygen as a sputtering gas used at the time of the sputtering and setting the partial pressure ratio of oxygen in the sputtering gas to more than 2% and not more than 30%;
    setting the pressure of the sputtering gas to more than 0.01 Pa and not more than 3.0 Pa;
    setting the density of high frequency electric power applied to a target during the sputtering is more than $1.0 W/cm^2$ and not more than $10 W/cm^2$; and
    wherein a ratio of Pb atoms to all atoms in the B site is more than 3% and not more than 30%.

8. The method for manufacturing a piezoelectric material according to claim 7, wherein the pressure of the sputtering gas is set to more than 0.01 Pa and not more than 1.0 Pa.

9. The method for manufacturing a piezoelectric material according to claim 7, wherein the partial pressure ratio of oxygen in the sputtering gas is set to more than 2% and not more than 10%.

10. The method for manufacturing a piezoelectric material according to claim 7, wherein the density of high frequency electric power applied to a target during the sputtering is set to more than $2.5 W/cm^2$ and not more than $10 W/cm^2$.

11. A piezoelectric element comprising:
    a first electrode provided on a substrate;
    a piezoelectric material provided on the first electrode and has a perovskite type crystal structure represented by a formula $ABO_3$; and
    a second electrode provided on the piezoelectric material,
    wherein the main component for the A site of the piezoelectric material is Pb,
    the main components for the B site of the piezoelectric material are Zr, Ti and Pb, and
    a ratio of Pb atoms to all atoms in the B site of the piezoelectric material is more than 3% and not more than 30%.

12. A piezoelectric element comprising:
    a first electrode provided on a substrate;
    a piezoelectric material provided on the first electrode and has a perovskite type crystal structure represented by a formula $ABO_3$; and
    a second electrode provided on the piezoelectric material,
    wherein the main component for the A site of the piezoelectric material is Pb, the main components for the B site of the piezoelectric material are Zr, Ti and Pb, a ratio of Pb atoms to all atoms in the B site of the piezoelectric material is more than 3% and not more than 30%; and wherein a compositional molar ratio of Zr and Ti in the B site of the piezoelectric material, i.e., Zr/(Ti+Zr) is increased from the first electrode side toward the second electrode side.

13. A piezoelectric element comprising:

a first electrode provided on a substrate;

a piezoelectric material provided on the first electrode and has a perovskite type crystal structure represented by a formula $ABO_3$; and a second electrode provided on the piezoelectric material, wherein the main component for the A site of the piezoelectric material is Pb, the main components for the B site of the piezoelectric material are Zr, Ti and Pb, a Pb atom in the A site of the piezoelectric material exists as $Pb^{2+}$, and a Pb atom in the B site of the piezoelectric material exists as $Pb^{4+}$; and wherein a ratio of Pb atoms to all atoms in the B site is more than 3% and not more than 30%.

14. A piezoelectric element comprising:

a first electrode provided on a substrate;

a piezoelectric material provided on the first electrode and has a perovskite type crystal structure represented by a formula $ABO_3$; and a second electrode provided on the piezoelectric material, wherein the main component for the A site of the piezoelectric material is Pb, the main components for the B site of the piezoelectric material are Zr, Ti and Pb, a Pb atom in the A site of the piezoelectric material exists as $Pb^{2+}$, and a Pb atom in the B site of the piezoelectric material exists as $Pb^{4+}$; and wherein a compositional molar ratio of Zr and Ti in the B site of the piezoelectric material, i.e., Zr/(Ti+Zr) is increased from the first electrode side toward the second electrode side.

15. An ink jet head that comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink, and that is configured so as to discharge the ink in the pressure chamber by displacing the vibration plate in the thickness direction of the piezoelectric material because of the piezoelectric effect of the piezoelectric material, wherein the main component for the A site of the piezoelectric material is Pb, the main components for the B site of the piezoelectric material are Zr, Ti and Pb, and a ratio of Pb atoms to all atoms in the B site of the piezoelectric material is more than 3% and not more than 30%.

16. An ink jet head that comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink, and that is configured so as to discharge the ink in the pressure chamber by displacing the vibration plate in the thickness direction of the piezoelectric material because of the piezoelectric effect of the piezoelectric material, wherein the main component for the A site of the piezoelectric material is Pb, the main components for the B site of the piezoelectric material are Zr, Ti and Pb, a Pb atom in the A site of the piezoelectric material exists as $Pb^{2+}$, and a Pb atom in the B site of the piezoelectric material exists as $Pb^{4+}$, and wherein a ratio of Pb atoms to all atoms in the B site is more than 3% and not more than 30%.

17. An ink-jet recording apparatus that comprises an ink jet head which comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink and which ink jet head is configured so as to be capable of relative movement with respect to a recording medium, and said ink-jet recording apparatus being configured so as to displace the vibration plate in the thickness direction of the piezoelectric material because of the piezoelectric effect of the piezoelectric material in the ink jet head while the ink jet head is being relatively moved with respect to the recording medium in order to discharge the ink in the pressure chamber from a nozzle hole communicating with the pressure chamber toward the recording medium and to perform recording, wherein the main component for the A site of the piezoelectric material in the ink jet head is Pb, the main components for the B site of the piezoelectric material are Zr, Ti and Pb, and a ratio of a Pb atom to all atoms in the B site of the piezoelectric material is more than 3% and not more than 30%.

18. An ink-jet recording apparatus that comprises an ink jet head which comprises a piezoelectric material with a perovskite type crystal structure represented by a formula $ABO_3$, a pair of electrodes respectively provided on surfaces of the piezoelectric material in its thickness direction, a vibration plate which is provided on the surface of the one electrode opposite the surface on which the piezoelectric material is provided and a pressure chamber member which is joined on the surface of the vibration plate opposite the surface on which the one electrode is provided and is used for configuring a pressure chamber for accommodating an ink and which ink jet head is configured so as to be capable of relative movement with respect to a recording medium, said ink-jet recording apparatus being configured so as to displace the vibration plate in the thickness direction of the piezoelectric material because of the piezoelectric effect of the piezoelectric material in the ink jet head while the ink jet head is being relatively moved with respect to the recording medium in order to discharge the ink in the pressure chamber from a nozzle hole communicating with the pressure chamber toward the recording medium and to perform recording, wherein the main component for the A site of the piezoelectric material in the ink jet head is Pb, the main components for the B site of the piezoelectric material are Zr, Ti and Pb, a Pb atom in the A site of the piezoelectric material exists as $Pb^{2+}$, and a Pb atom in the B site of the piezoelectric material exists as $Pb^{4+}$, and wherein a ratio of Pb atoms to all atoms in the B site is more than 3% and not more than 30%.

* * * * *

UNITED STATES PATENT AND TRADEMARK OFFICE
CERTIFICATE OF CORRECTION

PATENT NO.       : 7,048,360 B2
APPLICATION NO.  : 10/478567
DATED            : May 23, 2006
INVENTOR(S)      : Isaku Kanno et al.

It is certified that error appears in the above-identified patent and that said Letters Patent is hereby corrected as shown below:

Title:   item 54 and Col. 1, Line 1

"Piezoelectric Body, Manufacturing Method Thereof, Piezoelectric Element Having the Piezoelectric Body, Inject Head, and Inject Type Recording Device" should be -- Piezoelectric Material and its Manufacturing Method, and Piezoelectric Element, Ink Jet Head and Ink-Jet Recording Apparatus Equipping the Piezoelectric Material--

In the Claims:

Column 14, Line 14, Claim 6, "Zr(Ti+Zr)" should be -- Zr/(Ti+Zr) --

Signed and Sealed this

Ninth Day of January, 2007

JON W. DUDAS
*Director of the United States Patent and Trademark Office*